United States Patent
Mann et al.

(10) Patent No.: US 10,358,739 B2
(45) Date of Patent: Jul. 23, 2019

(54) HETEROEPITAXIAL HYDROTHERMAL CRYSTAL GROWTH OF ZINC SELENIDE

(71) Applicant: The United States of America, as represented by the Secretary of the Air Force, Washington, DC (US)

(72) Inventors: James Matthew Mann, Springboro, OH (US); Martin M. Kimani, Bellbrook, OH (US); Eric Michael Hunt, Glen Rock, PA (US); Michael R. Snure, Dayton, OH (US)

(*) Notice: Subject to any disclaimer, the term of this patent is extended or adjusted under 35 U.S.C. 154(b) by 0 days.

(21) Appl. No.: 15/794,654

(22) Filed: Oct. 26, 2017

(65) Prior Publication Data

US 2018/0171505 A1   Jun. 21, 2018

Related U.S. Application Data

(60) Provisional application No. 62/434,609, filed on Dec. 15, 2016.

(51) Int. Cl.
    *C30B 7/10* (2006.01)
    *C30B 29/48* (2006.01)
    *C30B 7/14* (2006.01)

(52) U.S. Cl.
    CPC ............... *C30B 7/10* (2013.01); *C30B 7/14* (2013.01); *C30B 29/48* (2013.01)

(58) Field of Classification Search
    CPC .............. C30B 7/10; C30B 7/14; C30B 29/48
    See application file for complete search history.

(56) References Cited

U.S. PATENT DOCUMENTS

| 3,356,463 | A |   | 12/1967 | Ballman et al. |
|-----------|---|---|---------|----------------|
| 4,579,622 | A | * | 4/1986  | Caporaso ............... C30B 7/00 117/71 |
| 4,632,711 | A |   | 12/1986 | Fujita et al. |
| 4,944,900 | A |   | 7/1990  | Willingham et al. |
| 5,015,327 | A |   | 5/1991  | Taguchi et al. |

(Continued)

FOREIGN PATENT DOCUMENTS

CN         102677176        9/2012

OTHER PUBLICATIONS

E. D. Kolb et al., "Hydrothermal Crystallization of Some II-VI Compounds" J. Cryst. Growth. vol. 3,4 (1968) 422-425.

(Continued)

*Primary Examiner* — Robert M Kunemund
(74) *Attorney, Agent, or Firm* — AFMCLO/JAZ; Chastity Whitaker

(57) ABSTRACT

A method of synthesizing zinc selenide crystals. The method includes forming an aqueous growth medium by combining a mineralizer solution of an alkali nutrient with a feedstock including zinc and selenium. A seed crystal is added to the growth medium. The aqueous growth medium and seed crystal are pressurized and a thermal gradient applied such that a temperature of a first portion of the aqueous growth medium is greater than a second portion of the aqueous growth medium. The zinc and selenium are dissolved into the mineralizer solution from the feedstock in the first portion of the aqueous growth medium and spontaneously forms at least one single crystal of zinc selenide on the seed crystal in the first portion of the aqueous growth medium.

18 Claims, 5 Drawing Sheets

(56) References Cited

U.S. PATENT DOCUMENTS

| | | |
|---|---|---|
| 5,126,081 A | 6/1992 | Willingham et al. |
| 5,192,419 A | 3/1993 | Matsuura et al. |
| 5,205,967 A | 4/1993 | Macken |
| 5,242,709 A | 9/1993 | Chaffin, III |
| 5,299,217 A | 3/1994 | Migita et al. |
| 5,341,001 A | 8/1994 | Hayashi et al. |
| 5,554,219 A | 9/1996 | Fukuda et al. |
| 9,670,589 B2 | 6/2017 | Mann et al. |
| 2014/0216925 A1 | 8/2014 | Myers et al. |
| 2014/0353579 A1 | 12/2014 | Greco et al. |
| 2016/0348267 A1 | 12/2016 | Mann et al. |
| 2016/0348268 A1 | 12/2016 | Mann et al. |

OTHER PUBLICATIONS

E. D. Kolb et al., "Hydrothermal Crystallization of Zinc Selenide" J. Cryst. Growth., vol. 7 (1970) 199-201.

Machine Translation, Chinese U.S. Pat. No. 102677176, Published Sep. 19, 2012.

\* cited by examiner

HETEROEPITAXIAL HYDROTHERMAL CRYSTAL GROWTH OF ZINC SELENIDE

Pursuant to 37 C.F.R. § 1.78(a)(4), this application claims the benefit of and priority to prior filed Provisional Application Ser. No. 62/434,609, filed Dec. 15, 2016, which is expressly incorporated herein by reference in its entirety.

RIGHTS OF THE GOVERNMENT

The invention described herein may be manufactured and used by or for the Government of the United States for all governmental purposes without the payment of any royalty.

FIELD OF THE INVENTION

The present invention relates generally to crystal growth and, more particularly, to heteroepitaxial hydrothermal crystal growth.

BACKGROUND OF THE INVENTION

Hydrothermal crystal growth processes are utilized for growing a wide variety of single crystals. In a typical hydrothermal process, a pressure vessel, e.g., a cylindrical pressure vessel, having a baffle to produce a temperature gradient is partially filled at room temperature with an aqueous solution (a growth medium). A solid form nutrient material or feedstock (e.g., powder or crystalline) is introduced on one side of the baffle and one or more seed crystals are introduced on the other side of the baffle.

To ensure solubility and phase stability of the nutrient in the growth medium, compositions such as hydroxides, fluorides, phosphates, borates, and chlorides (typically denominated mineralizers) are added to the growth medium. These mineralizers also have an effect of decreasing the pressure encountered at a given temperature while increasing the solubility of the nutrient in the growth medium.

The pressure vessel is sealed and heating is initiated on the nutrient end to establish a thermal gradient thereby creating two thermal zones. As the temperature rises, the growth medium expands, fills the vessel (in some instances), and concomitantly causes an elevation in the internal pressure of the vessel.

At the relatively hotter end, the solid form nutrient dissolves into the growth medium, while at the cooler end it is deposited on a seed crystal, growing the desired crystal.

Various commercially available ZnSe crystals are currently produced by a chemical vapor deposition ("CVD") technique. However, ZnSe crystals grown by the commercial CVD technique suffers from multiple grains with various orientations when ZnSe crystals of substantial size (greater than about 5 mm$^2$) are fabricated, and therefore are not suitable for use toward producing orientation-patterned ("OP") ZnSe substrates.

Additionally, previous hydrothermal growth of ZnSe described by Laudise, et al. (see "Hydrothermal Crystallization of Some II-VI Compounds" J. Cryst. Growth. 3,4, 422-425 (1968); and "Hydrothermal Crystallization of Zinc Selenide" J. Cryst. Growth. 7, 199-201 (1970)), detailed growth of ZnSe by spontaneous nucleation and transport growth in NaOH and NaOH/LiOH solutions at temperatures of 350° C. Laudise et al. achieved hydrothermal growth of ZnSe onto a ZnSe seed crystal of CVD origin and therefore demonstrated bulk growth possibilities by hydrothermal synthesis. However, the conditions employed require a very small temperature gradient, ranging from about 2° C. to about 5° C., which is difficult to control and maintain. With the exception of the (111) face, Laudise et al.'s method manifested in the overall growth quality having cracks and inclusions in the grown crystal. Additionally, spurious nucleation in the upper section of the reaction vessel detracted from growth onto the seed crystal.

Thus, there remains a need for new hydrothermal methods of growing high quality zinc selenide crystals of high purity and significant size.

SUMMARY OF THE INVENTION

The present invention overcomes the foregoing problems and other shortcomings, drawbacks, and challenges of conventional zinc selenide crystal growth. While the invention will be described in connection with certain embodiments, it will be understood that the invention is not limited to these embodiments. To the contrary, this invention includes all alternatives, modifications, and equivalents as may be included within the spirit and scope of the present invention.

According to an embodiment of the present invention, a method of synthesizing a ZnSe crystal includes forming an aqueous growth medium by combining a mineralizer solution of an alkali nutrient with a feedstock including zinc and selenium. A seed crystal is added to the growth medium. The aqueous growth medium and seed crystal are pressurized and a thermal gradient applied such that a temperature of a first portion of the aqueous growth medium is greater than a second portion of the aqueous growth medium. The zinc and selenium are dissolved into the mineralizer solution from the feedstock in the first portion of the aqueous growth medium and spontaneously forms at least one single crystal of zinc selenide on the seed crystal in the first portion of the aqueous growth medium.

In accordance with aspects of the present invention, the gallium arsenide seed crystal may have an orientation selected from [001], [010], [011], [100], [101], [110], or [111]. The gallium arsenide seed crystal may optionally be miscut in a range from about 0° to about 10° toward an axis or crystallographic direction.

In accordance with another aspect of the present invention, an orientation-patterned GaAs substrate may be utilized to form orientation-patterned zinc selenide thereon. In this embodiment, the orientation-patterned GaAs substrate comprises the gallium arsenide seed crystal having a plurality of regions, and adjacent regions of the plurality of have inverted polarity.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
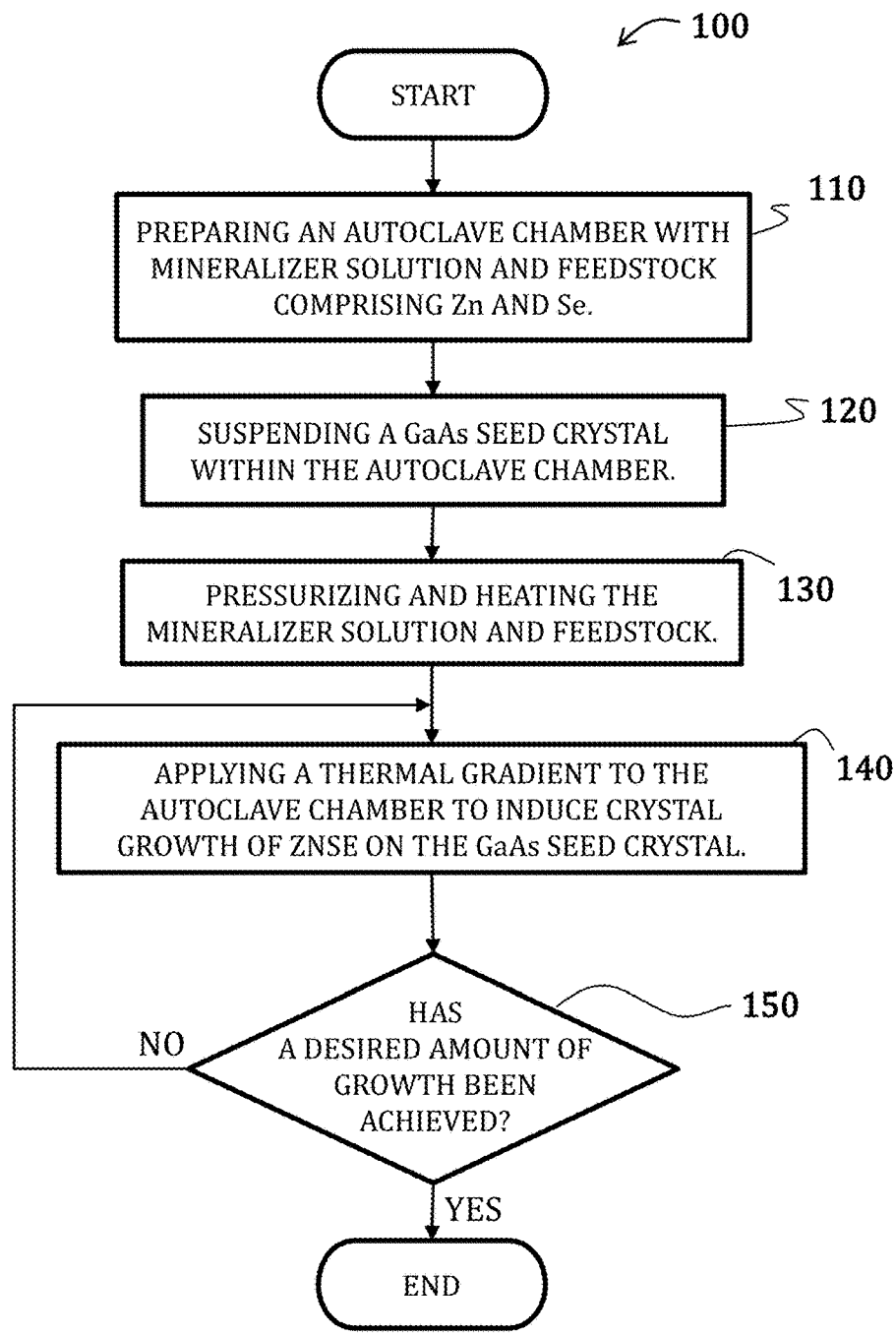
FIG. 1 is a flowchart illustrating a method of synthesizing zinc selenide crystals, in accordance with an embodiment of the present invention.

Referring now to the figures, and in particular to FIG. 1, a flowchart illustrating a method 100 of synthesizing single crystals of zinc selenide (ZnSe) and an exemplary apparatus for carrying out the method 100 are described in accordance with an embodiment of the present invention. The method 100 includes preparing an autoclave with a mineralizer solution and feedstock comprising zinc and selenium (Block 110); suspending a GaAs seed crystal within the autoclave chamber (Block 120); pressurizing and heating the mineralizer solution and feedstock (Block 130); and applying thermal gradient to the autoclave chamber to induce crystal growth of ZnSe on the GaAs seed crystal (Block 140). The thermal gradient applied to the autoclave chamber creates two thermal zones: in a first (higher temperature) zone, zinc and selenium are dissolved into the mineralizer solution from the feedstock and in a second (lower temperature) zone, at least one zinc selenide single crystal spontaneously forms onto the gallium arsenide seed crystal. The process is allowed to continue until a desired amount of growth has been achieved ("Yes" branch of Decision Block 150).

The mineralizer solution, which is generally used for improving dissolution of the feedstock and facilitating both the rate and quality of crystal growth, may include ions such as hydroxyl (OH$^-$), carbonate (CO$_3^{-2}$), nitrate (NO$_3^-$), a halide such as F$^-$ or Cl$^-$, or H$^+$ in various concentrations in water. The mineralizer may include, but is not limited to, alkali hydroxides, ammonium hydroxide, alkali halides, alkali carbonates, alkali fluorides, or mixtures thereof. Mineralizer solutions may have concentrations ranging from about 0.1 M to about 30 M. For example, the mineralizer concentration may be about 0.1 M, about 0.5 M, about 1 M, about 2 M, about 3 M, about 4 M, about 5 M, about 6 M, about 7 M, about 8 M, about 9 M, about 10 M, about 12 M, about 15 M, about 18 M, about 20 M, about 25 M, about 30 M, or in a range between any two of the foregoing. In some embodiments, the mineralizer solution comprises a mixture of an alkali hydroxide (e.g., sodium hydroxide) and an alkali halide (e.g., sodium chloride). In other embodiments, the mineralizer solution may comprise a sodium hydroxide solution having a molarity of about 1 to about 15 M. For example, the sodium hydroxide solution may be about 3 M to about 8 M, such as about 5 M. The water may be distilled or deionized to minimize or eliminate unwanted impurities.

In order to form zinc selenide, the feedstock utilized in the embodiments of the present invention comprises zinc and selenium. Exemplary sources of zinc include zinc metal, zinc oxide, zinc halides, zinc selenide, or combinations thereof. Similarly, sources of selenium include selenium metal, selenide salts such as alkali selenides (e.g., sodium selenide) or metal selenides (e.g., zinc selenide), or combinations thereof. The feedstock may be present as a bulk solid, or may be provided in smaller particulate forms (e.g., amorphous, crystalline, or polycrystalline).

In an embodiment, the feedstock may comprise zinc and selenium metals, which upon reaction with a hydroxide mineralizer forms Zn$^{-2}$ and Se$^{-2}$ in situ, as shown in Equations 1-3, below.

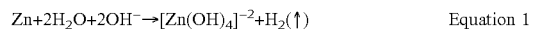
$$Zn+2H_2O+2OH^- \rightarrow [Zn(OH)_4]^{-2}+H_2(\uparrow) \qquad \text{Equation 1}$$

$$Se+2OH^-+H_2 \rightarrow Se^{-2}+2H_2O \qquad \text{Equation 2}$$

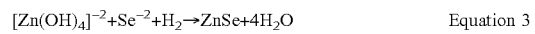
$$[Zn(OH)_4]^{-2}+Se^{-2}+H_2 \rightarrow ZnSe+4H_2O \qquad \text{Equation 3}$$

Each of Zn and Se reacts with NaOH and thereby dissolves into the hydrothermal solution or aqueous growth medium. In Equation 1, zinc is oxidized to form an amphoteric zinc (II) hydroxide complex and liberates hydrogen. In Equation 2, Se is reduced to Se$^{-2}$ by H$_2$ generated in Equation 1. In order to completely reduce Se to Se$^{-2}$, a molar excess of Zn is typically used to generate enough H$_2$ and maintain sufficient reducing ambient in the hydrothermal system. For example, a stoichiometric ratio of Zn:Se in the feedstock may be about 1.5:1.

In another embodiment, the feedstock comprises ZnSe, which may be present in powdered or polycrystalline form.

In some instances, a doped-ZnSe crystal may be desirable. Accordingly, and in such other embodiments, the feedstock may further include a dopant. The amount and selected species of dopant included in the feedstock is dependent upon various factors, including the intended application of the doped-ZnSe crystal. Exemplary non-limiting dopants may include a transition metal, a group 16 chalcogen, or combinations thereof. For example, the dopant may be chromium, manganese, iron, cobalt, nickel, tellurium, or combinations thereof. Dopants may be present in the feedstock in amount sufficient to achieve the desired level of doping in the ZnSe crystal. For example, the dopant may be present in about 0.05 atomic percent (at %), about 0.1 at %, about 0.2 at %, about 0.4 at %, about 0.5 at %, about 0.7 at %, about 0.9 at %, about 1.0 at %, about 1.2 at %, about 1.5 at %, about 2.0 at %, about 2.5 at %, about 3.0 at %, about 5 at %, about 10 at %, or in a range between any two of the foregoing. In one embodiment, the at % is based on the zinc atoms or zinc ions in the feedstock. In another embodiment, the at % is based on the selenium atoms or selenide ions in the feedstock.

In accordance with embodiments of the present invention, crystalline gallium arsenide may be utilized as a seed upon which single crystals of zinc selenide form. The gallium arsenide seed crystal may have an orientation selected from [001], [010], [011], [100], [101], [110], or [111]. Additionally, the gallium arsenide seed crystal may be optionally miscut in a range from about 0° to about 10° toward an axis or crystallographic direction. In an embodiment, the gallium arsenide seed crystal is (111) oriented GaAs. In another embodiment, the gallium arsenide seed crystal may be about 2° or about 4° miscut GaAs substrate. In yet another embodiment, the GaAs seed substrate may comprise a gallium arsenide seed crystal having a first polarity, in combination with an inverse polarity gallium arsenide seed crystal, where the opposing polarity crystals are arranged to form an orientation-patterned GaAs substrate. Accordingly, growth of zinc selenide on the orientation-patterned GaAs substrate forms orientation patterned zinc selenide.

Figure 2:
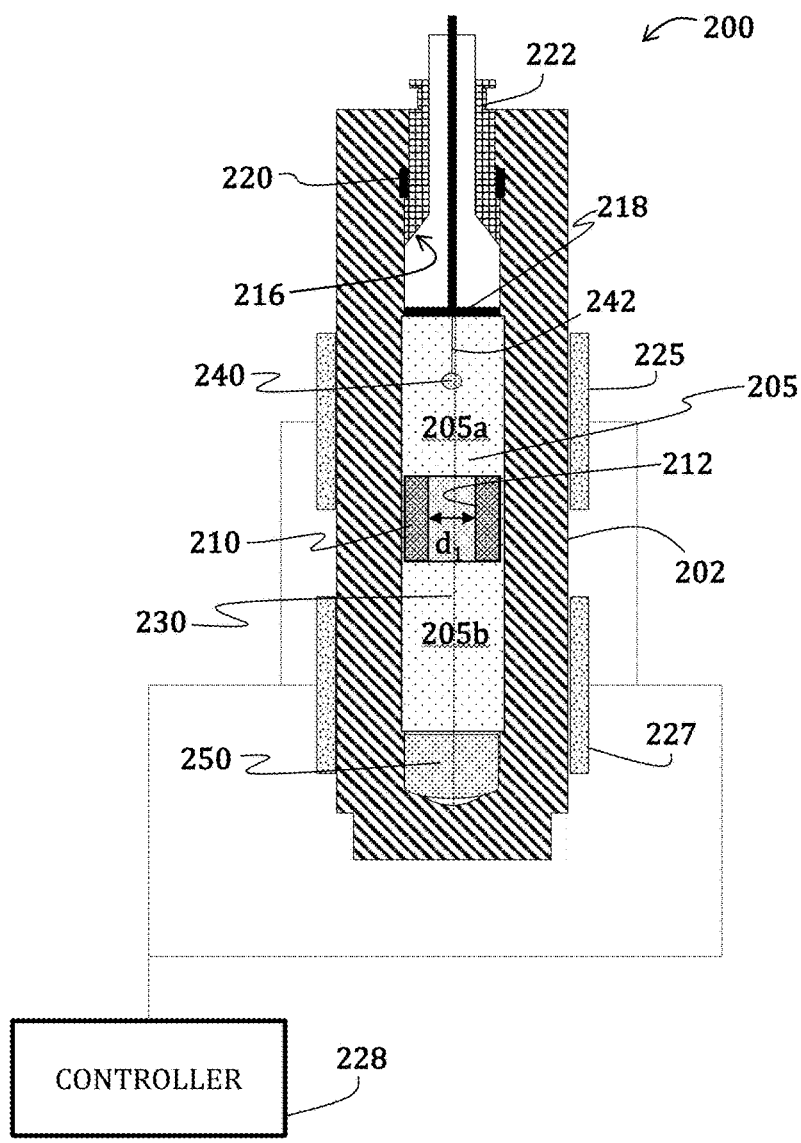
FIG. 2 is a side elevational view of an autoclave, shown in cross-section, suitable for performing the method of FIG. 1.

An exemplary, pressurizable reaction device or autoclave 200 suitable for carrying out embodiments of the present invention is illustrated in FIG. 2. However, those skilled in the art having the benefit of the disclosure provided herein would readily appreciate that the illustrated structure is non-limiting. The autoclave 200 includes a wall 202 enclosing a chamber 205, which may be separated into upper and lower regions 205a, 205b by a baffle 210. The baffle 210 may be constructed from any inert material, for example, a precious metal, and includes an opening 212 therein having a diameter, dl, selected to permit fluid communication therethrough ranging from about 15% to about 45%. In this way, the baffle 210 permits fluidic communication between the upper and lower regions 205a, 205b of the chamber 205 while maintaining these regions 205a, 205b as separate. Although the baffle 210 is illustrated as having a single opening 212, it would be readily understood that more than one opening may be used. For example, according to some embodiments of the present invention, the baffle 210 may include a plurality of openings, may comprise a mesh material, or may comprise a porous material, for example.

The chamber 205 is accessible through an open end 216, into which a plug 218 and seal 220 may be inserted and secured with a locking collar before pressurizing the chamber 205.

Externally, heaters 225a, 225b (two are shown) at least partially surround the wall 202 of the autoclave 200, where upper heater 225a and lower heater 225b correspond to upper and lower chambers 205a, 205b, respectively. The heaters 225 are independently operably coupled to a controller 228, which may be configured to operably control the heaters 225a, 225b such that the upper chamber 205a may be heated to a temperature that is different from a temperature of the lower chamber 205b. Said another way, the heaters 225a, 225b may be operated so as to form a temperature gradient between the upper and lower chambers 205a, 205b. According to embodiments of the present invention, and as described in great detail below, the temperature gradient variation may range from a minimum of about 2° C. to a maximum of about 80° C., and the temperature range for growth is between about 175° C. and about 350° C.

The heaters 225a, 225b may have any suitable structure, form, or number. Particularly, and as shown, band heaters 225a, 225b are used to circumferentially surround the wall 202 and chamber 205 therein. Other constructions and methods may be used, so long as a temperature difference exists along a longitudinal axis 230 of the chamber 205 of the autoclave 200.

Although not shown, to prevent or minimize corrosion of the internal cavity of the autoclave 200, protective inserts are commonly used. These protective inserts may have the same shape as the chamber 205 of the autoclave 200 and fit in the internal cavity (contact-type insert) of the chamber 205, or the insert may be a "floating" type insert which occupies only part of the autoclave interior. Exemplary embodiments showing these types of protective inserts are disclosed in U.S. patent application Ser. No. 15/077,299 filed Mar. 22, 2016, which is incorporated herein by reference in its entirety. Non-limiting exemplary materials used to construct protective inserts include carbon-free iron, copper, nickel, tantalum, silver, gold, platinum, titanium, glass (or quartz), or Teflon, depending on the temperature, feedstock, and mineralizer solution used.

Referring again to the embodiment shown in FIG. 2, the chamber 205 is charged with the feedstock 250 and a suitable mineralizer solution. Typically, the chamber 205 is filled to about 40 vol % to about 95 vol % of the chamber's internal volume. If necessary, although not shown, deionized water may be added to the chamber 205 such that a total volume of feedstock 250, mineralizer solution, and water achieves the desired fill volume of the chamber's internal volume. Due to the thermal expansion of fluids, the fill percentage is dependent upon the desired crystal growth pressure, temperature, and temperature gradient.

The GaAs seed crystal 240 may then be suspended within the upper chamber 205a. Suspension of the GaAs seed crystal 240 may be realized using a wire 242 constructed from an inert material, such as a precious metal. Alternatively, clamps or a woven wire mesh may be invoked.

Prior to heating the autoclave 200 and its contents, any trapped or dissolved oxygen may be removed by bubbling an inert gas through the mineralizer solution. Alternatively, a freeze-thaw-degas process may be used.

The chamber 205 of the autoclave 200 may then be sealed and then heat applied to the autoclave 200 and its contents via heaters 225, 227, which concomitantly causes an increase in the internal pressure within the chamber 205. In accordance with embodiments of the present invention, the internal pressure may be in a range from about 250 pounds per square inch gauge (psig) to about 40,000 psig. For example, the crystal growing pressure may be about 300 psig, about 400 psig, about 500 psig, about 800 psig, about 1,000 psig, about 1,200 psig, about 1,400 psig, about 1,500 psig, about 1,600 psig, about 1,800 psig, about 2,000 psig, about 2,500 psig, about 3,000 psig, about 5,000 psig, about 10,000 psig, about 20,000 psig, or about 30,000 psig. In an embodiment, the crystal growing pressure may be in a range from about 500 psig to about 2,000 psig.

Differential heating by the heaters 225, 227 causes a temperature gradient to be formed along the longitudinal axis 230 of the chamber 205. The lower chamber 205b (or first zone) may be heated to a temperature in a range from about 175° C. to about 350° C. This elevated temperature causes a partial amount of the zinc/selenium feedstock (and dopant when present) to enter the mineralizer solution to form an aqueous growth medium. Concurrently, the upper chamber 205a (or second zone) may be heated to a temperature within about 2° C. to about 100° C. of the temperature of the lower chamber 205b. In other words, a temperature gradient of about 2° C. to about 100° C. exists between the first and second zones (upper and lower chambers 205a, 205b, respectively).

After a sufficient duration of heating the lower chamber 205b at the desired temperature, the aqueous growth medium may be near or at saturation. Convection currents causes the saturated aqueous growth medium to flow upward through the baffle 210 (if present) into the lower temperature zone in the upper chamber 205a. At this lower temperature, the solubility of zinc selenide in the aqueous growth medium is reduced and, resultantly, zinc selenide can precipitate out of solution and spontaneously grow crystals onto the GaAs seed crystal 240 (FIG. 2). The process will continue until stopped or the feedstock supply is consumed.

One of the advantages of the disclosed hydrothermal ZnSe crystal growth process is its relatively low operating temperatures. This simplifies operating conditions and drastically minimizes the amount of strain between the GaAs seed crystal and the forming ZnSe crystal. Moreover, the identical crystal structure and small lattice mismatch of 0.27% allows the heteroepitaxial growth of ZnSe on GaAs using the disclosed hydrothermal technique. Thus, large area substrates of ZnSe of good quality using a GaAs template seed can be realized.

In general, growth rate of a developing region can be between about 1 μm/hr to about 5 μm/hr, or from about 30 μm/day to about 150 μm/day. The identity and concentration of a dopant typically has little effect on the rate of layer growth. Rather, the rate of crystal growth can be controlled by the identity and concentration of a mineralizer as well as the temperature gradient across the reactor and the nature of the host material. The relatively slow growth rates can be beneficial, as this can allow for precise control of the thickness of the forming crystal. For example, a process can reliably grow a region at about 2 μm/hr or about 25 μm/day and can thus be used to grow a region of about 100 μm over four days.

Heating and crystallization continue ("No" branch of decision block 150, FIG. 1) until a final crystal is achieved and having one or more of a desired purity, a desired quality, and a desired size. While these characteristics of the final crystal are at least partially dependent on reaction duration, generally crystal growth nominally continues for about 10 days to about 90 days.

When the desired growth is achieved ("Yes" branch of decision block 150), the process ends, the heat and pressure are removed from the chamber 205 such that crystal may be retrieved.

According to some embodiments of the present invention, the use of one or more seed crystal 240 may be required or desired. In yet another embodiment, the GaAs seed substrate may comprise a gallium arsenide seed crystal having a first polarity, in combination with an inverse polarity gallium arsenide seed crystal, where the opposing polarity crystals are arranged to form an orientation-patterned GaAs substrate. Accordingly, growth of zinc selenide on the orientation-patterned GaAs substrate forms orientation-patterned zinc selenide.

Some variations on the foregoing procedure include the use of precious metals to contain the reaction. When the mineralizer solution is extremely corrosive, it is common to enclose the reaction in a precious metal tube/container constructed of silver, gold, or platinum. When the container is placed in the autoclave, water is added into the space between the sealed precious metal container and the autoclave. This water serves as counter-pressure for the pressure generated from the mineralizer solution inside the precious metal container and thus prevents rupture of the container. In some cases, the precious metal container is affixed to the inner side walls of the autoclave and no counter-pressure water is required.

Thus, in accordance with yet another embodiment, an ampoule 260 may be constructed of a precious metal (silver, gold, platinum, or palladium, for example) and, according to some embodiments of the present invention, may comprise a metal tubing, such as those commercially-available from by Refining Systems, Inc. (Las Vegas, Nev.) and having one end welded or otherwise closed to retain the feedstock and the mineralizer solution therein. As noted above, the ampoule 260 comprises two zones, an upper ampoule zone 260a and a lower ampoule zone 260b, which correspond to the upper and lower chambers 205a, 205b, respectively.

Figure 3:
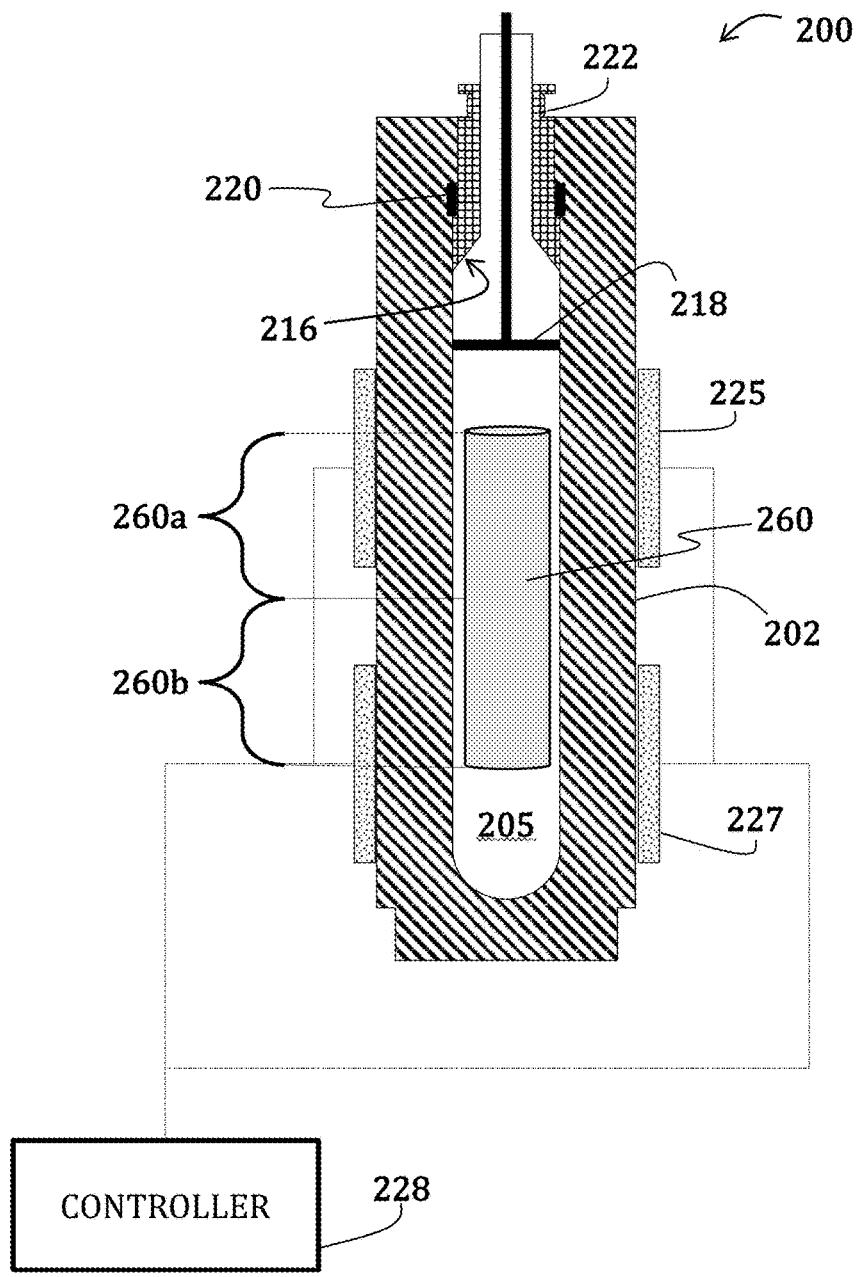
FIG. 3 is a side elevational view of an autoclave, shown in cross-section, having an ampoule within its reaction chamber that is suitable for performing the method of FIG. 1.

Referring again to Block 110 in FIG. 1, the feedstock 250 and the mineralizer solution are added to the ampoule 260 until a combined total of the feedstock 250 and mineralizer solution within the ampoule 260 is set to occupy a majority percentage (ranging from about 40% to about 90%) of the ampoule's total volume. The ampoule 260 may then be sealed (for example, by welding any open end) and is positioned within the chamber 205 of the autoclave 200 shown in FIG. 3. If necessary, although not shown, de-ionized water may be added to the chamber 205 such that a total volume of ampoule 260 and water occupies about 65% to about 90% of the chamber's internal volume.

Figure 4:
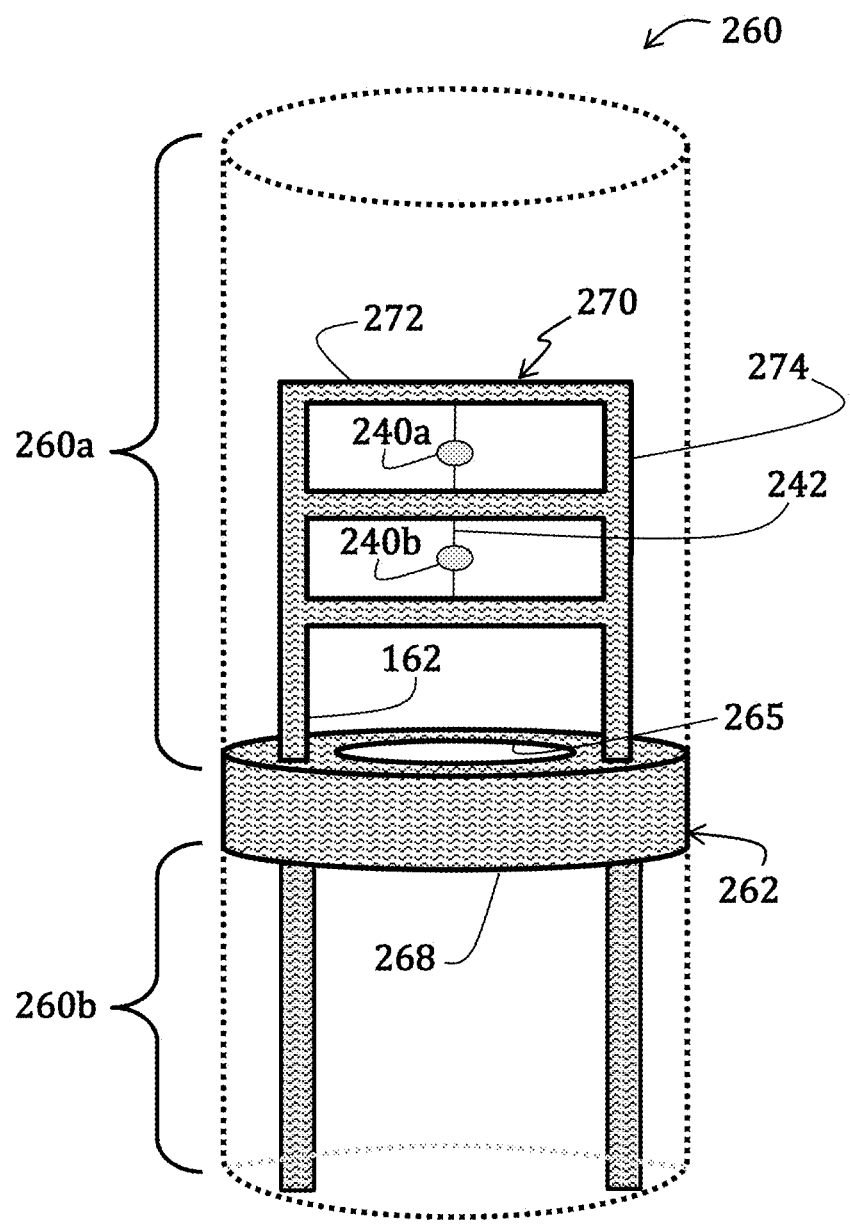
FIG. 4 is a side elevational view of an exemplary ampoule suitable for use in synthesizing zinc selenide crystals, in accordance with an embodiment of the present invention.

Similar to the alternate embodiment described above, an ampoule 260, used in accordance with methods described herein, may further comprise a baffle 262, with or without a seed ladder 270, the latter of which is shown in FIG. 4 (the ampoule 260 being in phantom). The baffle 262 with ladder 270 may comprise a unitary construction of an inert material (such as a precious metal) or, alternatively, may be separately constructed and joined together. As was noted above, the construction may include any inert material, for example, precious metals.

The baffle 262 includes an opening 265 within a main body 268 having a diameter selected to permit fluid communication therethrough ranging from about 15% to about 45% and so as to permit fluidic communication between the upper and lower regions 260a, 260b of the ampoule 260, while maintaining these regions 260a, 260b as separate.

The seed ladder 270 includes a one or more rungs 272 (three rungs 272 are shown) extending from vertical supports 274. Seed crystals 240a, 240b are positioned between adjacent ones of the rungs 272 by at least one wire 242 constructed from an inert material. In this way, more than one seed crystal 240 may be used for growing crystals.

Figure 5:
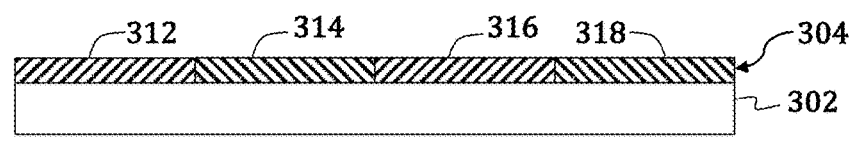
FIGS. 5 and 6 are schematics illustrating a method of growing OP zinc selenide arsenide crystals in accordance with an embodiment of the present invention.
Figure 6:
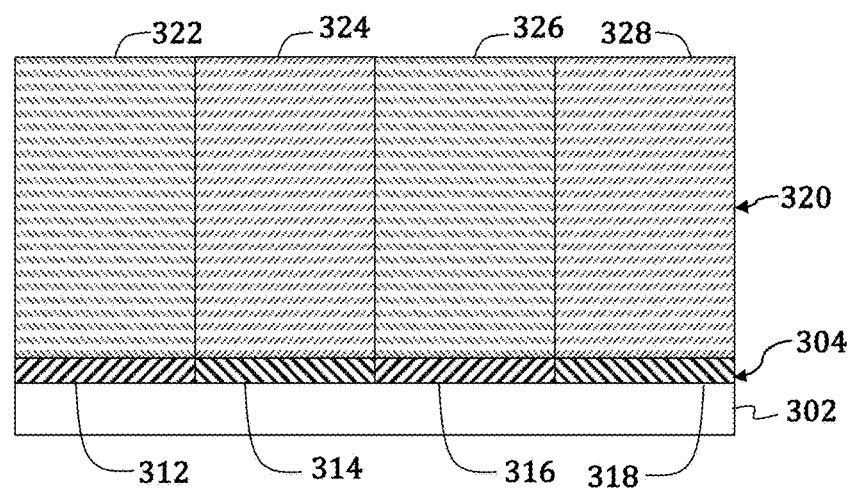

Referring now to FIGS. 5 and 6, schematics illustrating growth of an orientation patterned ("OP") crystals, in particular, an OP zinc selenide crystal, is shown and includes a single crystal gallium arsenide substrate 302 with a layer 304 of OP gallium arsenide thereon. The layer includes a plurality of regions (four regions 312, 314, 316, 318 are shown), wherein adjacent ones of the plurality of regions 312, 314, 316, 318 have an inverse polarity of the gallium arsenide. Crystal growth onto the substrate 302 and layer 304 of OP gallium arsenide may be accomplished in accordance with embodiment of the present invention (including the illustrative method 100 of FIG. 1) to form a new growth layer 320 comprising a corresponding plurality of zinc selenide crystal regions (again four regions 322, 324, 326, 328 are shown), wherein adjacent ones of the plurality of zinc selenide crystal regions 322, 324, 326, 328 have alternating regions of inverse polarity zinc selenide.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

EXAMPLE 1

A powdered or polycrystalline nutrient/feedstock of ZnSe is placed in the lower heating zone of the autoclave. A seed crystal of (111) oriented GaAs is suspended in the upper zone of the autoclave on a seed rack constructed of silver, gold, or platinum. A 5 M sodium hydroxide mineralizer solution is added to 70% fill of the precious metal container. A baffle constructed of precious metal is placed between the seed and the ZnSe nutrient with a 15% opening. Once all the reactants and seed rack have been loaded into a precious metal container, the container is welded shut and loaded into an autoclave. The external fill between the walls of the autoclave and the walls of the container are filled with water to a 75% to 80% fill level. Band heaters are placed on the external surface of the autoclave with the nutrient zone held at 230° C. and the seed zone heated to 215° C. The reaction duration is dependent on the size of the crystal desired, but is nominally ranges from 10 days to 90 days. The growth pressure is held within a range of about 500 psig to about 2000 psig.

The result was a single crystal layer of zinc selenide on the gallium arsenide seed. The thickness of the single crystal layer was dependent upon growth duration and could range from a few hundred micron to millimeters.

EXAMPLE 2

In another example, ZnSe is grown onto (100) GaAs. In this example, the lower zone temperature is held at 300° C. and the upper zone maintained at 230° C. A 5 M sodium hydroxide solution is still utilized as the mineralizer and the pressure is held at 2000 psig.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of synthesizing a zinc selenide single crystal substrate, the method comprising:
    forming an aqueous growth medium by combining a mineralizer solution comprising an alkali nutrient with a feedstock comprising zinc and selenium;
    adding a seed crystal to the aqueous growth medium, the seed crystal comprising gallium arsenide;
    pressurizing the aqueous growth medium; and
    applying a thermal gradient to the pressurized aqueous growth medium and the seed crystal such that a first portion of aqueous growth medium is heated to a temperature that is greater than a temperature of a second portion of the aqueous growth medium,
    wherein zinc and selenium are dissolved into the mineralizer solution from the feedstock in the first portion of the aqueous growth medium and at least one crystal of zinc selenide spontaneously forms onto the seed crystal in the second portion of the aqueous growth medium;
    and wherein a maximum temperature of the thermal gradient is less than about 350° C. at the applied pressure.

2. The method of claim 1, wherein the gallium arsenide seed crystal has an orientation selected from [001], [010], [011], [100], [101], [110], or [111].

3. The method of claim 1, wherein the gallium arsenide seed crystal is optionally miscut in an angle ranging from about 0° to about 10° toward an axis.

4. The method of claim 1, wherein the gallium arsenide seed crystal is an orientation-patterned crystal that further comprises:
    a plurality of regions, each region of the plurality having an inverted polarity compared to adjacent ones of the plurality of regions.

5. The method of claim 4, wherein the at least one crystal growing on the orientation-patterned gallium arsenide crystal is an orientation patterned zinc selenide crystal.

6. The method of claim 1, wherein the feedstock comprises zinc selenide.

7. The method of claim 1, wherein the feedstock comprises a combination of a zinc compound and a selenium compound.

8. The method of claim 1, wherein the feedstock further comprises a dopant.

9. The method of claim 8, wherein the dopant is selected from the group consisting of a transition metal, a group 16 chalcogen, and combinations thereof.

10. The method of claim 8, wherein the dopant is selected from the group consisting of chromium, manganese, iron, cobalt, nickel, tellurium, and combinations thereof.

11. The method of claim 1, wherein the mineralizer solution comprises an alkali hydroxide, ammonium hydroxide, an alkali halide, ammonium halide, an alkali fluoride, ammonium fluoride, an alkali carbonate, or combinations thereof.

12. The method of claim 1, wherein the mineralizer solution comprises the alkali nutrient at a concentration of about 0.1 mol/L to about 15 mol/L at 25° C. and 1 atm.

13. The method of claim 1, wherein the mineralizer solution comprises the alkali nutrient at a concentration of about 5 mol/L at 25° C., 1 atm, and wherein the alkali nutrient comprises sodium hydroxide.

14. The method of claim 1, further comprising:
    placing the aqueous growth medium and the seed crystal in an ampoule before pressurizing.

15. The method of claim 14, further comprising:
    placing a baffle in the ampoule and between the first and second portions.

16. The method of claim 1, wherein the second temperature of the second portion of the aqueous growth medium ranges from about 175° C. to about 350° C.

17. The method of claim 1, wherein the temperature difference between the first and second portions of the growth medium ranges from about 2° C. to about 100° C.

18. The method of claim 1, wherein pressurizing the aqueous growth medium is achieved by heating the aqueous growth medium in a sealed autoclave to a sufficient temperature to provide an internal pressure ranging from about 500 psig to about 2,000 psig.

* * * * *